(12) United States Patent
Jain et al.

(10) Patent No.: US 10,608,756 B2
(45) Date of Patent: Mar. 31, 2020

(54) POWER DETECTOR CALIBRATION IN INTEGRATED CIRCUITS

(71) Applicant: ANOKIWAVE, INC., San Diego, CA (US)

(72) Inventors: Vipul Jain, Irvine, CA (US); Robert Ian Gresham, Somerville, MA (US); Robert McMorrow, Concord, MA (US); David Warren Corman, Gilbert, AZ (US); Nitin Jain, San Diego, CA (US)

(73) Assignee: ANOKIWAVE, INC., San Diego, CA (US)

( * ) Notice: Subject to any disclaimer, the term of this patent is extended or adjusted under 35 U.S.C. 154(b) by 0 days.

(21) Appl. No.: 16/122,680

(22) Filed: Sep. 5, 2018

(65) Prior Publication Data

US 2020/0076515 A1  Mar. 5, 2020

(51) Int. Cl.
| | |
|---|---|
| *H04L 25/03* | (2006.01) |
| *H04B 17/13* | (2015.01) |
| *G06G 7/20* | (2006.01) |
| *H03G 3/30* | (2006.01) |
| *H04B 17/21* | (2015.01) |
| *H04L 27/00* | (2006.01) |
| *G01R 21/133* | (2006.01) |
| *G06F 1/28* | (2006.01) |

(52) U.S. Cl.
CPC ............ *H04B 17/13* (2015.01); *G06G 7/20* (2013.01); *H03G 3/3068* (2013.01); *H04B 17/21* (2015.01); *G01R 21/133* (2013.01); *G06F 1/28* (2013.01)

(58) Field of Classification Search
CPC .......... H04B 17/13; H04B 17/21; G06G 7/20; H03G 3/3068; G01R 21/133; G06F 1/28
USPC .......................... 375/224, 226, 295, 297, 316
See application file for complete search history.

(56) References Cited

U.S. PATENT DOCUMENTS

| | | | | |
|---|---|---|---|---|
| 7,826,417 B2 * | 11/2010 | Yang | ...................... | H04W 52/42 370/328 |
| 2005/0132241 A1 * | 6/2005 | Curt | .................... | G01R 19/2513 713/300 |

\* cited by examiner

*Primary Examiner* — Tesfaldet Bocure
(74) *Attorney, Agent, or Firm* — Mintz, Levin, Cohn, Ferris, Glovsky and Popeo, P.C.

(57) ABSTRACT

A system and a method for calibrating an output signal of an antenna is disclosed. In one aspect, an apparatus includes a first digital adder configured to generate a gain offset by at least adding gain calibration data from non-volatile memory and gain command data from static memory. The apparatus further includes an amplitude gain circuit configured to modify, based at least in part on the gain offset, an amplitude of a first output signal of a first antenna. The modified amplitude of the first output signal is provided to enable pre-calibration of the first output signal. The apparatus further includes a power detector configured to measure an output power of the first output signal. The apparatus further includes at least one processor configured to generate a difference between the measured and expected output power, and adjust gain command data in response to the generated difference.

21 Claims, 9 Drawing Sheets

POWER DETECTOR CALIBRATION IN INTEGRATED CIRCUITS

TECHNICAL FIELD

The subject matter described herein relates generally to power detectors.

BACKGROUND

Power detectors sample RF signals, and generate an output voltage corresponding to the power of the sampled signal. Depending on the type of power detector, the output voltage is proportional to either the root mean squared (rms) value, the log value, or a peak value of the sampled signal.

Transmitters may use power detectors to monitor and control transmitted signal power levels. For example, a power detector may quantify the signal power output by the transmitting antenna. If the output signal power is too high, the gain of a power amplifier that feeds signals to the transmitting antenna may be decreased. If the output signal is too low, the gain may be increased. These gain adjustments may be incorporated in feedback loops.

Receivers may use power detectors to monitor received signal power levels. For example, a power detector may quantify the received signal level at the receiving antenna. If the received signal power is too high, the gain of a low noise amplifier, which amplifies the received signal from the receiving amplifier, may be decreased. If the received signal power is too low, the gain may be increased. As with transmitters, these gain adjustments may be incorporated in feedback loops.

SUMMARY

Systems, methods, and articles of manufacture, including computer program products, are provided for power detector calibration in integrated circuits. In one aspect, there is a method that includes generating, by a first digital adder, a gain offset by at least adding gain calibration data from non-volatile memory and the gain command data from static memory. The method further includes modifying, by an amplitude gain circuit and based at least in part on the gain offset, an amplitude of a first output signal of a first antenna. The modified amplitude of the first output signal is provided to enable pre-calibration of the first output signal. The method further includes measuring, by a power detector, an output power of the first output signal. The method further includes generating, by a processor, a difference between the measured output power and an expected output power. The method further includes adjusting, by the processor, gain command data in response to the difference between the measured output power and the expected output power.

In optional variations one or more additional features, including but not limited to the following, may be included in any feasible combination. For example, measuring the output power of the first output signal may include detecting, by an analog power detector, the signal power of the first output signal. Measuring the output power of the first output signal may further include digitizing, by an analog-to-digital converter, the detected signal level. Measuring the output power of the first output signal may further include providing, by a non-volatile memory, an offset correction value. Measuring the output power of the first output signal may further include correcting, by a combiner circuit, the digitized signal power with the offset correction value. Measuring the output power further comprises applying, by a limiter circuit, a limit function to the corrected signal power. The method may further include providing, via multiple antennas including the first antenna, radio signals to a point in space where they constructively interfere with each other to form a directionally controlled beam. The method may further include generating, by a second digital adder, a phase offset by at least adding phase calibration data obtained from the non-volatile memory and phase command data obtained from the static memory. The method may further include modifying, by a phase-shift circuit and based at least in part on the phase offset, a phase of a first output signal. The modified phase of the first output signal is provided to enable pre-calibration of the first output signal. The method may further include comparing, by the processor, the generated difference between the measured output power and an expected output power to a threshold. The method may further include adjusting, by the processor, gain command data, iteratively, until the generated difference is less than the threshold. The gain calibration data may be programmed into the non-volatile memory via at least one of burning of fuses, one-time programming, and electrically erasable programmable read-only memory.

Systems and methods consistent with this approach are described as well as articles that comprise a tangibly embodied machine-readable medium operable to cause one or more machines (e.g., computers, etc.) to result in operations described herein. Similarly, computer systems are also described that may include a processor and a memory coupled to the processor. The memory may include one or more programs that cause the processor to perform one or more of the operations described herein.

The details of one or more variations of the subject matter described herein are set forth in the accompanying drawings and the description below. Other features and advantages of the subject matter described herein will be apparent from the description and drawings, and from the claims.

DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

DETAILED DESCRIPTION

Figure 1:
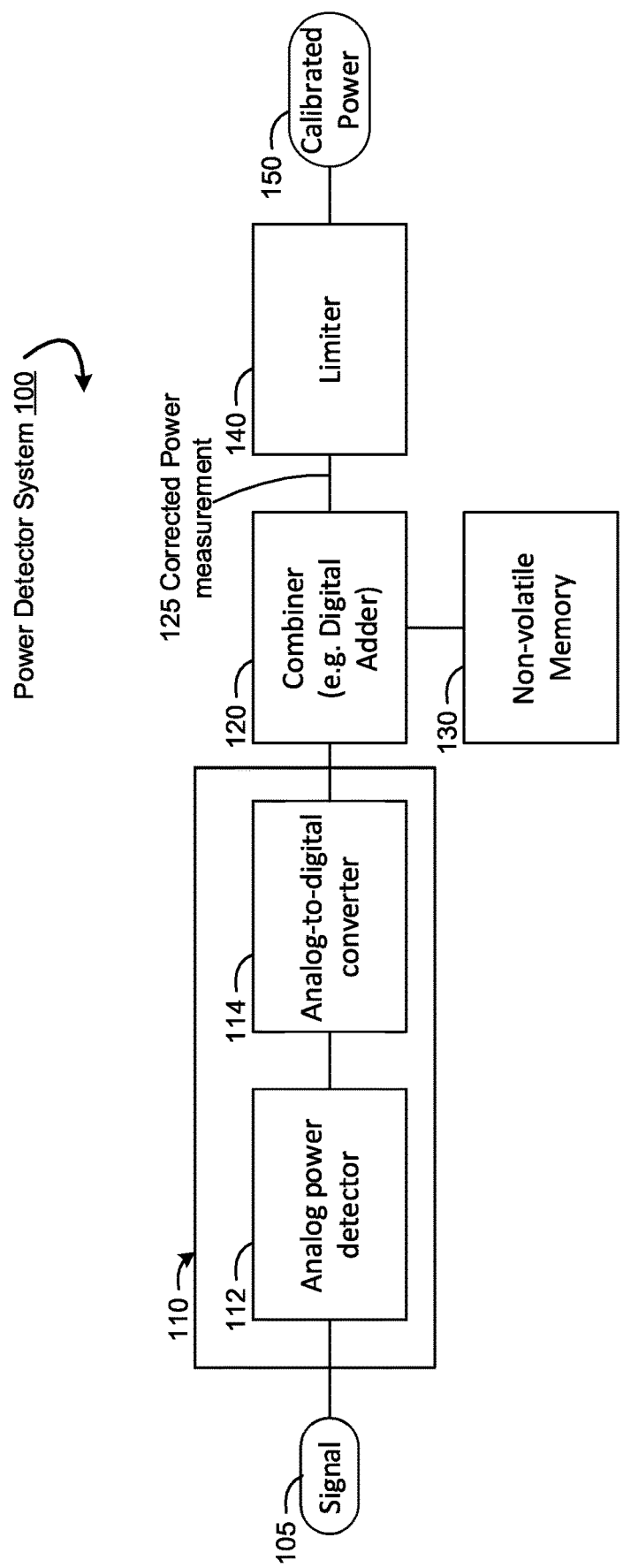
FIG. 1 depicts a block diagram of an example of an integrated circuit to detect power and apply power detection correction values.

Power detectors may have non-ideal characteristics due to variations in the circuit manufacturing process, or other factors. If the power detector is not calibrated to correct for these non-idealities, the power detector may be inaccurate. The inaccuracies may lead to incorrect adjustments. For example, a transmitter may use a power detector that has not been calibrated to measure the power of a signal outputted by a transmitting antenna, and incorrectly adjust the gain of a power amplifier that feeds signals to the transmitting antenna. Therefore, there is a need for on-chip calibration of power detectors to correct for power detector non-idealities for transmitters. The calibration enables more accurate measurement of transmitter output power, calibration of phased-array systems to reduce power dissipation and increase efficiency, and provide higher accuracy in phased array gain and phase calibration.

Other systems use power detectors to quantify transmitted or received RF signal power, and adjust amplifier gains based on the measured power. These systems include phased arrays and active antennas for satellite communications (SATCOM), RADAR, 5G communications, and unattended autonomous vehicles (UAV). Active antennas are sometimes referred to as active electronically steered arrays (AESA).

Systems may benefit from more accurate measurement of transmitted output power as follows. An accurate, calibrated power detector generates an error vector between an expected output signal power and an actual output signal power for each array element. The error vector may arise due to device variations. A more accurate estimate of the error vector allow more accurate adjustments of output power, and alignment among different array elements. With this more accurate alignment of array elements, the active array may maximize linear power output from the active array, without saturation. If the power detectors in the active antenna were not calibrated, they would not measure transmitted power as accurately as with calibrated power detectors. Therefore, the error vector would be less accurate, alignment of array elements would not be as accurate, and it would not be possible to maximize output power for the active antenna, without saturation. The maximized output power for the output antenna without saturation is referred to as the Maximum Linear Power (MLP). Inaccuracies in the power detectors may result in a less efficient array with a lower MLP.

The calibrated power detectors may also be used to better estimate gain calibration factors. For example, active antennas include multiple array elements. Different array elements may vary due to variations in the circuit, and losses in printed circuit board (PCB) manufacturing process. The variations may lead to beamforming inaccuracies and a reduced possible maximum linear power (MLP). While the variations may be corrected for at the system level, system calibration is typically more expensive than on-chip calibration for each array element resulting in a lower MLP and lower overall system efficiency.

In one aspect of the disclosed technology, calibrated power detectors are incorporated in individual array elements. These calibrated power detectors may also enable more accurate gain correction and power levels, on-chip, and for each array element. The calibrated power detectors may correct for printed circuit board (PCB) variations and variations due to temperature gradients in the integrated circuit. For example, even if gains are the same for two or more array elements, differences in temperature gradients or in the way the printed circuit board interacts with chips for each array element may lead to differences in power. The calibrated power detectors enable adjustment of the input power or additional offset in gain applied to each chip to overcome variations between the printed circuit board and power of the chips for the individual array elements. This may reduce the need for, and/or improve, system level calibration.

The on-chip calibration may be applied to parts coming off of an assembly line. By determining gain offset values and power detection correction offset values for each part and applying these offsets, the parts may operate with substantially identical characteristics, with more accurate power gain and power detection capability. The parts may be incorporated into the above mentioned systems, including active antennas for SATCOM, RADAR, 5G communications, UAVs, and/or other types of systems. The calibration may overcome, for example, path-to-path gain (and therefore power) variations and/or path-to-path phase variations across a system.

In addition, more accurate power detection may allow more accurate detection of output power. Many real systems have a limit on radiated power due to regulatory requirements. The more accurate power detector may allow the system to operate just below a required regulatory threshold instead of requiring a larger margin to ensure that the regulatory threshold is not exceeded. Operating just below the required regulatory threshold may maximize communication speed and coverage.

FIG. 1 depicts a block diagram of an example of a power detector system 100 to detect power and apply power detection correction values. The power detector system 100 may include a power detector 110, a combiner 120, a non-volatile memory 130, and a limiter 140. The power detector 110 includes an analog power detector 112 and an analog-to-digital converter 114. The power detector system 100 may be packaged in a single integrated circuit. The power detector system 100 may be packaged in more than one integrated circuit.

A signal 105 may be input into the analog power detector 112, which outputs a signal power in analog form. The analog signal power that is output from the analog power detector 112 is input to ADC 114, which outputs a digitized signal power corresponding to the analog signal power. The digitized signal power, and an offset correction value from non-volatile memory 130 are each input to a combiner 120. The combiner 120 sums the digitized signal power and the offset correction value to form a corrected digitized signal power. The output of the combiner 120 is then input into a limiter 140, which applies a limiting function and then outputs a calibrated power 150.

The analog power detector 112 is configured to receive analog signal 105 transmitted over a communications channel. The analog signal 105 may have been received by an antenna and amplified by an amplifier before being provided to the analog power detector 112. In some embodiments, the analog power detector 112 is an envelope/peak detector. In other embodiments, the analog power detector is a root mean square (rms) responding power detector. The analog power detector 112 detects a power level of the received analog signal 105, and outputs a voltage corresponding to the detected power level. This analog power level is input by an analog-to-digital converter (ADC) 114, which digitizes the analog detected power level, resulting in a digital representation.

The power detector 110 components, including the analog power detector 112 and analog-to-digital converter 114 are electronic devices that may not be ideal. There may be variations in the manufacturing process. These variations may lead to imprecise or inaccurate power measurements. These non-idealities may lead to systematic and predictable deviations between actual and detected power levels. These deviations may be corrected by adding an offset correction value.

Combiner 120 combines the output of the analog to digital converter 114 with an offset correction value. In some embodiments, the combiner 120 is a digital adder. The combiner 120 combines (adds) the digital power level output by the analog to digital converter 114 to an offset correction value. This combination results in a corrected power measurement 125.

Non-volatile memory 130 stores the offset correction value used by the combiner 120 to correct for variations in the power dector 110 components. The combiner 120 adds an offset correction value from memory 130 to the digitized raw power detected by the power detector 110, to form a corrected digitized power value. In some embodiments, the combiner 120 may be a digital adder. The offset correction value may be obtained by the following process, although other techniques can be used as well. First, measure the signal 105 with a detector, such as an external power meter (not shown). Next, measure calibrated power 150 readings without the use of non-volatile memory 130, so that the combiner 120 circuit transmits the output of the power detector 110 without further combination. Next, use the difference between the measured signal 105 and the measured calibrated power 150 reading to determine the offset value that is stored in non-volatile memory 130.

One or more offset correction values may be stored in non-volatile memory 130. The non-volatile memory 130 may be on-chip memory, one-time programmable (OTP) memory, and/or hard-coded computer logic such as eFUSE. The variation (which may represent an error) represents the difference between actual and detected power levels. In some implementations, the variation may be a substantially constant offset over an operating range. In others, the variation may vary as a function of the power level of the incoming signal. If the error is substantially constant, a single offset correction value may be sufficient. However, different offset correction values corresponding to different power level ranges may be used if the error varies significantly. For example, 1, 2, 3, 5, 10, 20 or more correction values may be determined. Each correction value may correspond to at least one power level (or a range of power levels). Each offset correction value may be determined by inputting a signal of a known power level to the power detector, and comparing the output value of the power detector 110 to the known (e.g., actual) power level of the signal. At least one curve of correction values may be determined as a function of power level. The curve or correction values themselves may be stored in non-volatile memory 130.

In some example implementations, a limiter 140 applies a limit function so that the corrected digitized value falls within pre-specified limits. After calibration, for example, the detected output power may be limited to fall below a maximum power value. The output of the limiter 130 is thus a detected and calibrated power value that has been corrected for non-idealities, such as variations in the manufacturing process of the power detector.

Figure 2:
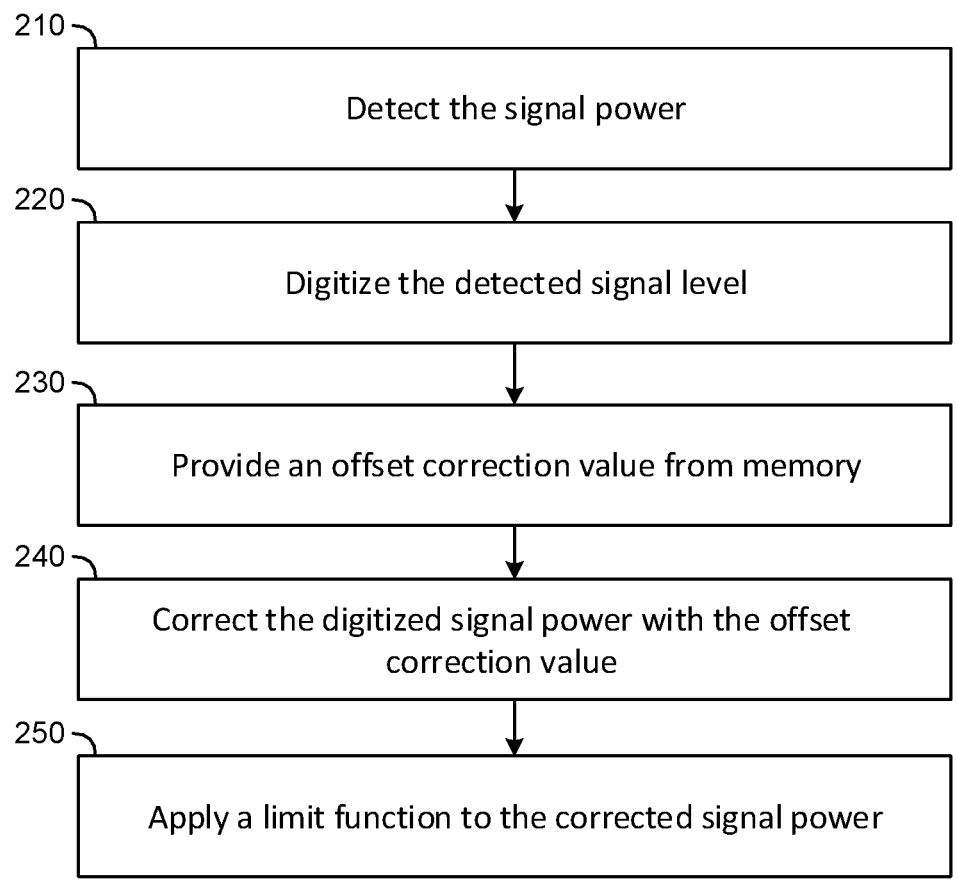
FIG. 2 depicts an example of a process for detecting power and applying power detection correction values.

FIG. 2 depicts an example of a process 200 for detecting power of a signal, and calibrating the detected power with an offset correction value. The description of process 200 also refers to FIG. 1.

At 210, the analog power detector detects the signal power of an incoming signal. For example, the analog power detector may receive a signal 105, such as an RF signal, and then detect a power level for the signal 105. This signal 105 may have been received via a communication link, coupling element, signal coupled from an amplifier or RF chain, antenna, and then amplified by a power amplifier. The detected power may be represented by an output voltage indicative of the power level (e.g., in dBm, the power ratio in decibels (dB) referenced to 1 milliwatt) of the signal 105.

At 220, the analog-to-digital converter digitizes the analog signal level detected by the analog power detector. For example, the analog-to-digital converter 114 may digitize the power level detected at 210. The output of the analog-to-digital converter 114 may be a digital representation of the power level detected at 210. As such, the output of the analog-to-digital converter 114 provides a digital indication of power level of the signal 105.

At 230, the memory provides an offset correction value. For example, an offset correction value may be obtained by reading memory 130. In some embodiments, memory 130 includes a single correction value for the full range of power levels. In other embodiments, multiple correction values are being used for different power levels, the correction value corresponding to the detected power level is provided. For example, a detected power of 1 dBm may be corrected by 1.5 dB to 2.5 dbm, and a detected power of 10 dBm may be corrected by 0.1 dB to 10.1 dBm.

At 240, a combiner combines the offset correction with the digitized power level. For example, the combiner 120 may combine (e.g., add, subtract, and/or the like) the digitized power level output (which is output by the analog-to-digital converter 114) and the offset correction value (which may be obtained from memory 130) to form a corrected power measurement value 125. This corrected power measurement 125 may be more accurate than the digitized power level output from the analog-to-digital converter 114.

At 250, a limiter 140 may apply a limiting function to the corrected power measurement value 125. This is needed because digital registers have limited range, due to a finite number of bits for the register. For example, a digital register may have 16 bits. The register may overflow if a correction value is added to the register once all bits in the register have a value of 1.

Figure 3:
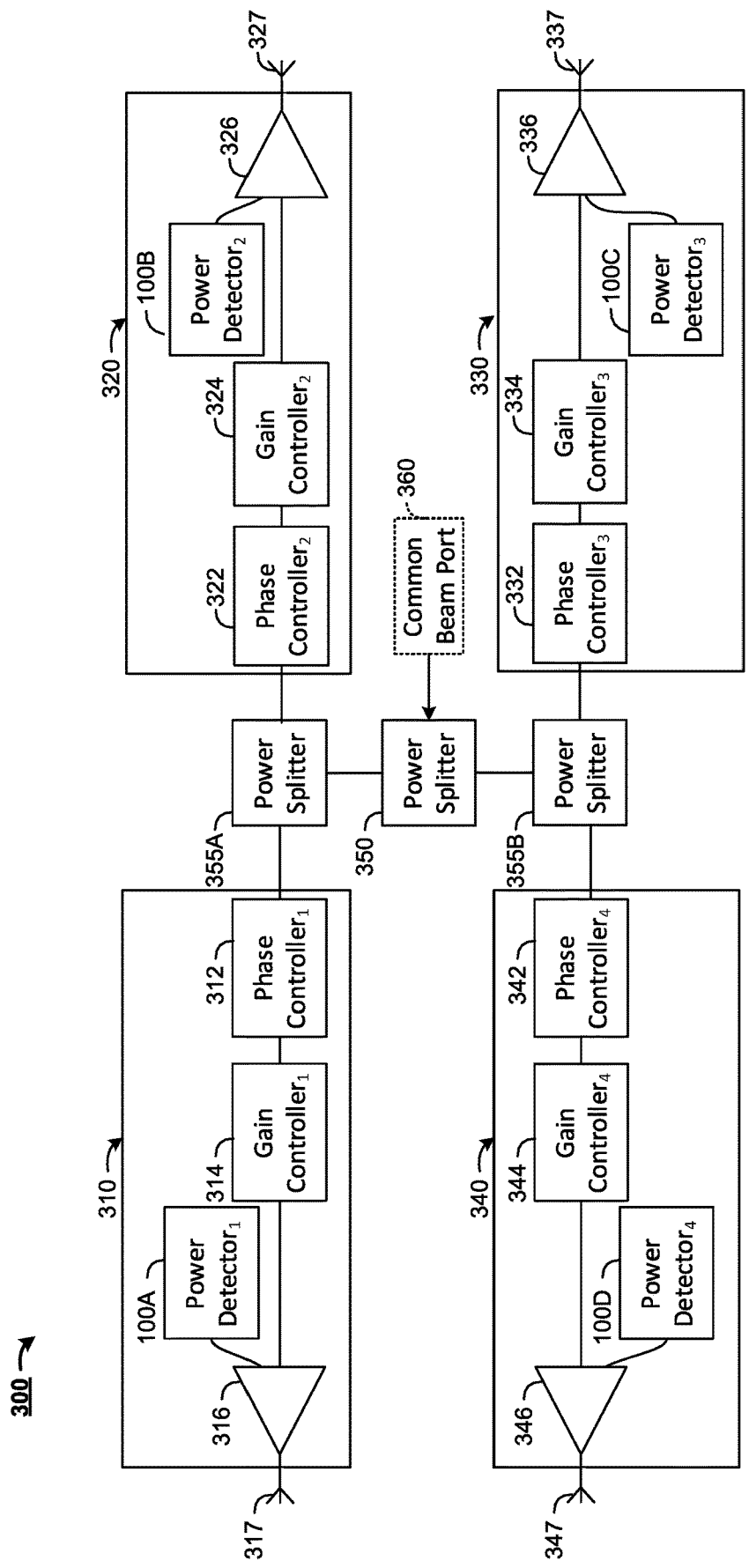
FIG. 3 depicts a block diagram of an example of a beamforming transmission integrated circuit.

FIG. 3 depicts a block diagram of an example of a transmit beamforming integrated circuit (IC) 300. Beamforming IC 300 may be referred to as a beamforming network. The beamforming IC 300 may be implemented on one or more integrated circuits. Beamforming IC 300 is a four element array, with element arms 310, 320, 330 and 340. Element arm 310 includes phase controller₁ 312, gain controller₁ 314, power detector₁ 100A, and output amplifier₁ 316 connected to antenna 317. The phase controller₁ 312, gain controller₁ 314, and output amplifier₁ 316 are connected serially. The power detector₁ 100A is also connected to output amplifier₁ 316. Element arm 310 receives power from power splitter 355A. Power detector 100A has the same structure of power detector 100, described above with respect to FIG. 1.

The other element arms 320, 330, 340 have similar components and layouts. Element arms 320, 330, and 340 include phase controllers 322, 332, and 342, gain controllers 324, 334, and 344, power detectors 100B, 100C, and 100D, and outputs 326, 336, and 346, respectively. The phase controllers 322, 332, and 342, gain controllers 324, 334, and 344, outputs 326, 336, and 346, and antennas 327, 337, and 347, respectively, are connected serially. The power detectors 100B, 100C, and 100D, respectively, are also connected to outputs 326, 336, and 346, respectively. Element arm 320 receives power from power splitter 355A. Element arms 330 and 340 receive power from power splitter 355B. Power detectors 100B, 100C, and 100D may have the same structure of power detector 100, described above with respect to FIG. 1.

Although the IC 300 is illustrated with four elements, more or fewer elements may be present in other implementations. Further, in various implementations, additional, fewer, and/or alternative components may be present within the IC 300. In various implementations, the IC 300 may include at least one receiver that connects to at least one antenna with at least one front end switch.

Power splitters 355A and 355B receive power from power splitter 350. A common beam port 360 may be provided to power splitter 350. Power splitters 350 may split received power in half, and route each half to power splitters 355A and 355B. Power splitter 355A may then split power received from power splitter 350 in half, and route each half to element arms 310 and 320. Similarly, power splitter 355B may split power received from power splitter 350 in half, and route each half to element arms 330 and 340. Just as different implementations may have more or fewer element arms, other implementations may have more or fewer power splitters.

The output amplifiers 316, 326, 336, and 346 of each element arm 310, 320, 330, and 340 may be provided to one or more antenna. The one or more antenna may or may not be on the beamforming IC 300. The use of gain and phase control (e.g., phase and gain together may constitute a complex beam weight for each element) may allow for beamforming in an antenna far field, as described herein. In some aspects, the difference between a desired phase and a measured phase may be referred to as a phase error. The difference between a desired amplitude and a measured amplitude may be referred to as an amplitude error. A phase error combined with an amplitude error may result in a vector error, which may cause misalignment in beams, thereby requiring calibration at the active antenna level.

Power detectors 100A, 100B, 100C, and 100D may include components of the power detector 100 of FIG. 1, including analog power detector 112, analog-to-digital converter 114, non-volatile memory 130, and combiner 120. In some implementations, the power detectors 100A, 100B, 100C, and 100D may include limiter 140. Power detectors 100A, 100B, 100C, and 100D detects the power of the output signal to output amplifiers 316, 326, 336, and 346, respectively. The power detected by each power detector 100A, 100B, 100C, and 100D may be compared to an expected output power. This difference corresponds to an error, which may be corrected for by adjusting the output power using, for example, the gain controllers 314, 324, 334, and 344, respectively. Once corrected, power may be maximized linearly, without saturation and/or within radiation limits as prescribed by regulatory requirements.

The IC 300 may form at least a portion of an active antenna. Active antennas form electronically steerable beams, and are used in many radar and communications systems such as emerging 5G systems. In order to form a beam that spatially points in a given direction, beam steering must be applied such that energy from each radiating element may be coherently (e.g., in-phase, amplitude, and/or vector alignment) combined in the antenna's far field.

Active antennas may implement beam steering by providing a unique radio frequency (RF) phase shift and/or gain setting (e.g., a well-defined vector) between each radiating element (e.g., antenna) and a beam summation point. In some aspects, a beam summation point may be a point at which all of the signals generated by the active antenna converges, which may form a steerable beam. Thus, emission of separate radio wave signals which constructively interfere which each other may be used to steer a radio signal. However, in order for effective beamforming to be achieved, the energy from each element in the active antenna should arrive at the beam summation point at the same phase (e.g., via phase control), the same amplitude (e.g., via gain control), and/or the same vector orientation. Under certain circumstances, gain taper is utilized to improve the beam characteristics. Tapering may be used for side-lobe reduction or creating nulls the antenna array pattern. Often these well-defined patterns require accurate amplitude and phase calibration.

Some active antennas may calibrate an array of antenna elements by measuring the amplitude and phase at each element in the array in a near field antenna range. When all gain and phase states within the array are set to the same value, the measured gain and phase at each element will also be the same. However, this is generally not the case due to part-to-part variation within the beamforming ICs and/or other contributors in the array, such as passive beamforming networks, other ICs (e.g., on the wafer), and/or the like. When the gain and phase measured at each element are not the same, then the measured error at each element may be stored in an array look-up table and applied as an offset against the commanded amplitude and phase. However, this calibration process which requires continual monitoring, calculating, and updating may be time consuming and/or expensive for active antenna systems to employ.

When considering the sources of gain and/or phase error from path to path in the array, the dominant error may typically occur within the beamforming ICs. Passive power dividers and splitters may contribute relatively little error since they, by design, may be symmetric corporate feed structures (e.g., same line lengths on all paths), and/or since they are generally manufactured on a common printed circuit board (PCB) so some (if not all) paths may see the same or similar loss tangent and dielectric constant. Relative errors between/among the various paths in an array generally affect beamforming, whereas absolute changes in gain and phase in an array might not.

In some aspects, transmission phase variation (e.g., S21 phase variation) based on a Monte Carlo performed on a Ka-band (e.g., 26.5 GHz-40 GHz) beamforming transmission IC may be high. For example, a through-phase ±3 sigma process variation may be ±96 degrees. This may be extremely high compared to typical least significant bits (LSB) used in beam steering. For example, LSBs for four-bit, five-bit, and six-bit phase controllers may be 22.5 deg, 11.25 deg, and 5.625 deg, respectively. As systems may require all paths within an array to be matched within one LSB, processes for reducing the part-to-part variation in through-phase may be beneficial.

Elimination of high phase variation (and/or by similarity, gain variation) may be provided by correcting for variations on the beamforming IC (e.g., where the problem is rooted). In various implementations, a system may measure gain and phase of each path within the IC. For example, a membrane probe may be used to measure gain and/or phase differences between an input to a path and an output of the path (e.g., via one or more of the element arms 310, 320, 330, 340). In some aspects, the measurement process may be automated. Thereafter, based on the measurements, the system may program corrective calibration coefficient data into the IC in a permanent manner. For example, non-volatile programming may be achieved by using burning of fuses, one-time programming (OTP), electrically erasable programmable read-only memory (EEPROM), and/or other similar techniques or structures. In some aspects, the programming procedure(s) may also be automated.

In some aspects, correlation within a given die may negate the need to measure all paths within that die. For example, measurement of only one path and programming of the same calibration data into all paths may be implemented (e.g., to reduce IC test time). Additionally or alternatively, a process of reducing cost may leverage the high level of correlation of ICs within a given wafer. For example, in some aspects, a system may be configured to measure only one part (e.g., die) per wafer and/or program all die of the wafer with the same calibration coefficients. Additionally or alternatively, a system may be configured to measure a sample of ICs (e.g., die) on a given wafer and/or program all ICs from that wafer with average calibration coefficients.

Figure 4:
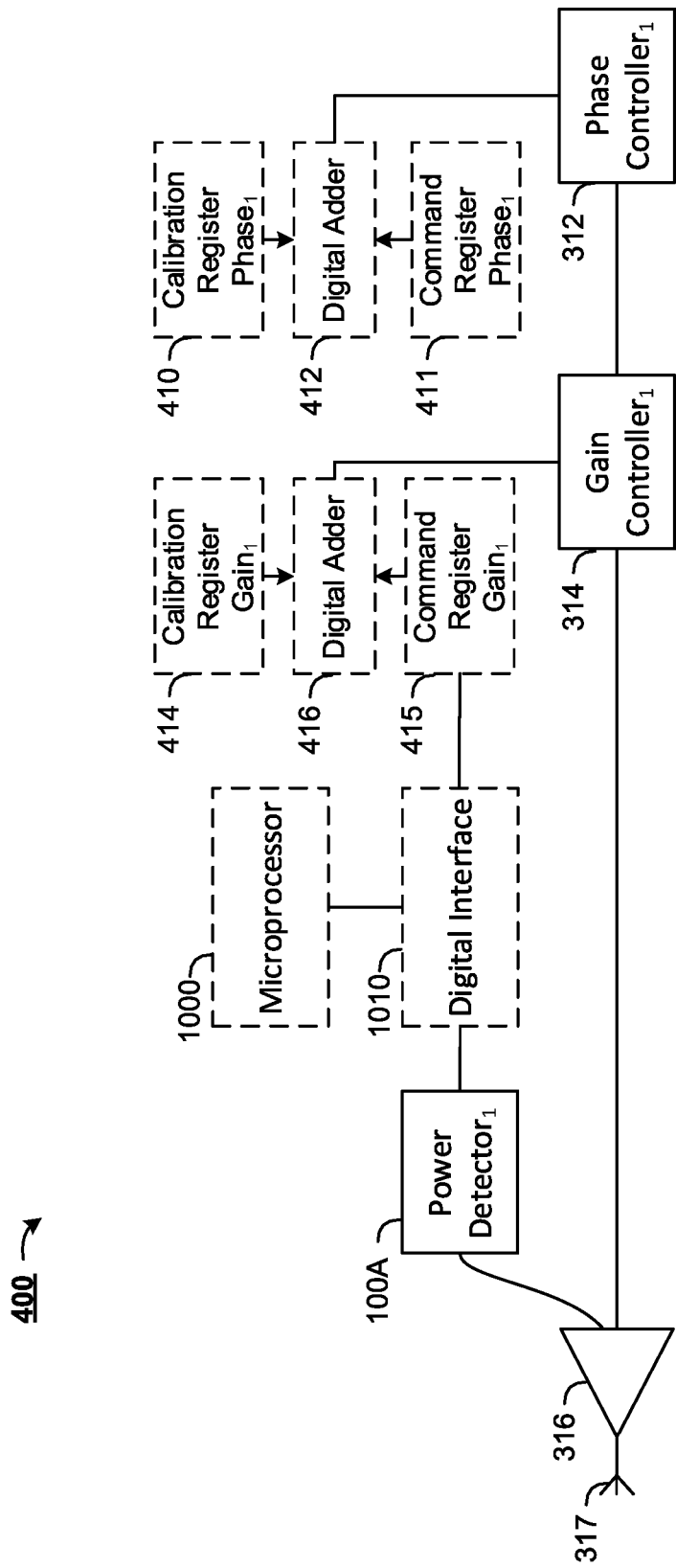
FIG. 4 depicts a block diagram of an example of a transmission integrated circuit with calibration details.

FIG. 4 depicts a block diagram of an example of a transmission integrated circuit 400. In some aspects, the transmission integrated circuit 400 is part of an antenna that is not part of a beamforming antenna. In some aspects, the transmission integrated circuit is part of a beamforming antenna, for example for the element arm 310. The illustrated dashed-line blocks may be digital functions (e.g., adding two or more values to create a new value) and/or the illustrated solid-line blocks may be RF functions (e.g., modifying an RF signal provided to an antenna). The power detector$_1$ 100A measurements are used to determine the difference between an actual transmitted power and an expected transmitted power. The difference corresponds to an error that may be compensated for by adjusting the calibration register gain$_1$ 414 value for element arm 310, and corresponding calibration for element arms 320, 330, and 340, respectively.

Microprocessor 1000 may be a separate integrated circuit that interfaces to components of the transmission integrated circuit 400 via a digital interface 1010. The digital interface 1010 may be a bus that interfaces between the microprocessor 1000 and at least power detector$_1$ 100A and command register gain$_1$ 415, as shown in FIG. 4. The digital interface 1010 may also interface between the microprocessor 1000 and one or more other components of the element arm depicted in FIG. 4, including the gain controller$_1$ 314, the phase controller$_1$ 312, command register phase$_1$ 411, and output amplifier$_1$ 316. The digital interface 1010 may also interface between the microprocessor 1000 and corresponding components of element arms 320, 330, and 340.

Microprocessor 1000 may compare the output measure of power detector 100A to an expected output, and generate a difference between the measured and expected radiated output. Microprocessor 1000 may compare the difference between the measured and expected radiated output to a threshold. If the difference is greater than the threshold, microprocessor 1000 may adjust a command register gain 415. These measurements, comparisons and adjustments may be repeated until the difference is less than or equal to the threshold.

Integrated circuit 300 uses the calibration data described herein (e.g., the calibration data from the non-volatile memory 130 of FIG. 1). The illustrated dashed-line blocks may be digital functions (e.g., adding two or more values to create a new value) and/or the illustrated solid-line blocks may be RF functions (e.g., modifying an RF signal provided to an antenna).

For example, calibration register phase$_1$ 410 may include calibration data from a non-volatile memory source (e.g., non-volatile memory 130) or from a static memory source, and command register phase$_1$ 411 may include command data from a static memory source, which may change multiple times at runtime. Based upon the values from these two registers 410, 411, a second digital adder 412 may be used to determine the sum of the two values. The determined sum may then be applied as a phase offset to a signal provided to an antenna through the phase block 312. A gain offset may similarly be applied to the signal provided to the antenna through the use of a calibration register gain$_1$ 414, a command register gain$_1$ 415, a first digital adder 416, and the gain controller 314. Although illustrated in sequence, in some implementations, the phase controller 312 and the gain controller 314 may be combined (such as in a combined vector modulator described herein) and/or may occur in a different order. Similar calibration may be applied to each array element 320, 330, and 340 of FIG. 3.

The approaches described herein may reduce the path-to-path phase variation to be within ±½ LSB for gain and/or phase, or a desired goal. Thus, the IC 400 may only otherwise be limited by the native granularity of the gain and phase functions. In some aspect, this all-digital approach may not impact or complicate RF functions in a meaningful way. As a non-limiting example of a benefit of the systems and/or methods described herein, Active antennas may be able to produce high quality beams upon array power up without need for calibration. Similarly, addressing the system-level issues described herein that consumers face may add value to consumer products (e.g., in 5G wireless communication).

In some aspects, if other ICs are used in cascade with the calibrated IC (e.g., IC 400), or if other array errors are significant then system calibration may also be used.

Figure 5:
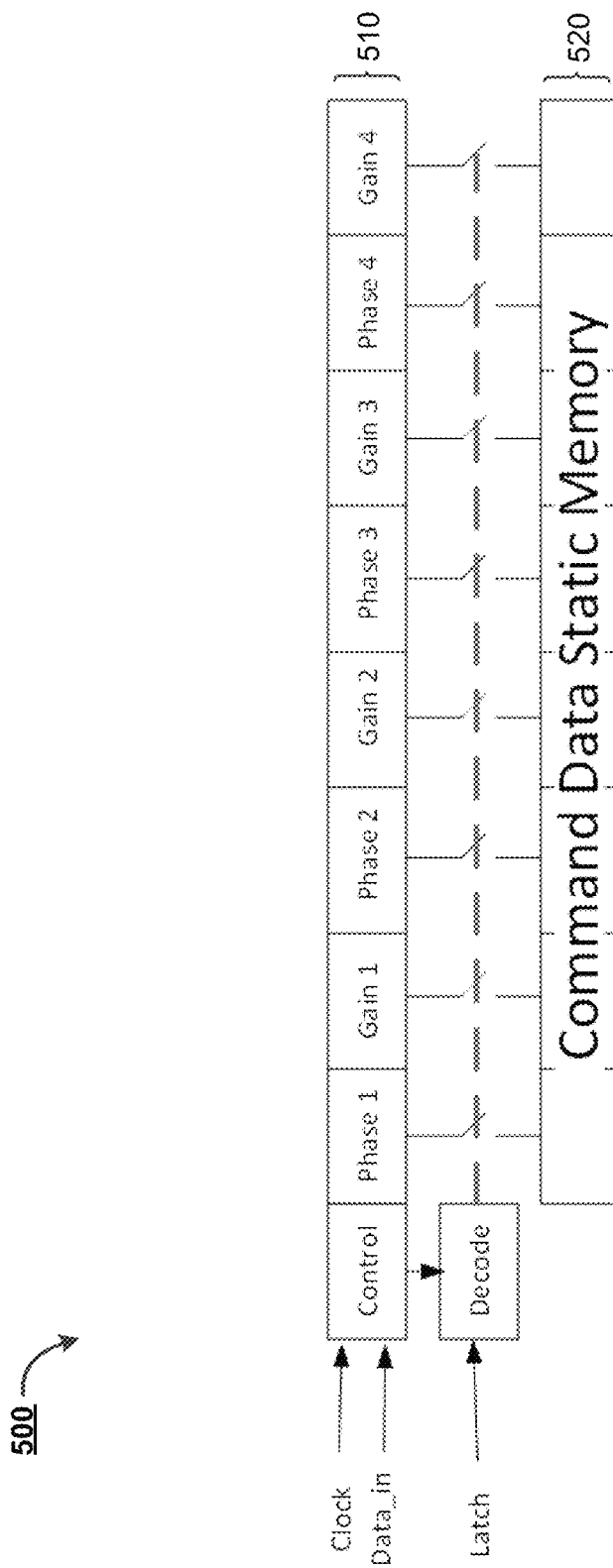
FIG. 5 depicts an example of a serial control system for a beamforming integrated circuit.

FIG. 5 depicts an example of a serial control system 500 for a beamforming integrated circuit. Serial control may be employed on active antenna beamforming ICs. As illustrated, serial command data 510 in the form of desired gain and phase settings for each of the four element arms may be clocked in and/or latched into static memory 520 (e.g., when the serial sequence has been completed). However, continually updating temporary memory may be inefficient.

Figure 6:
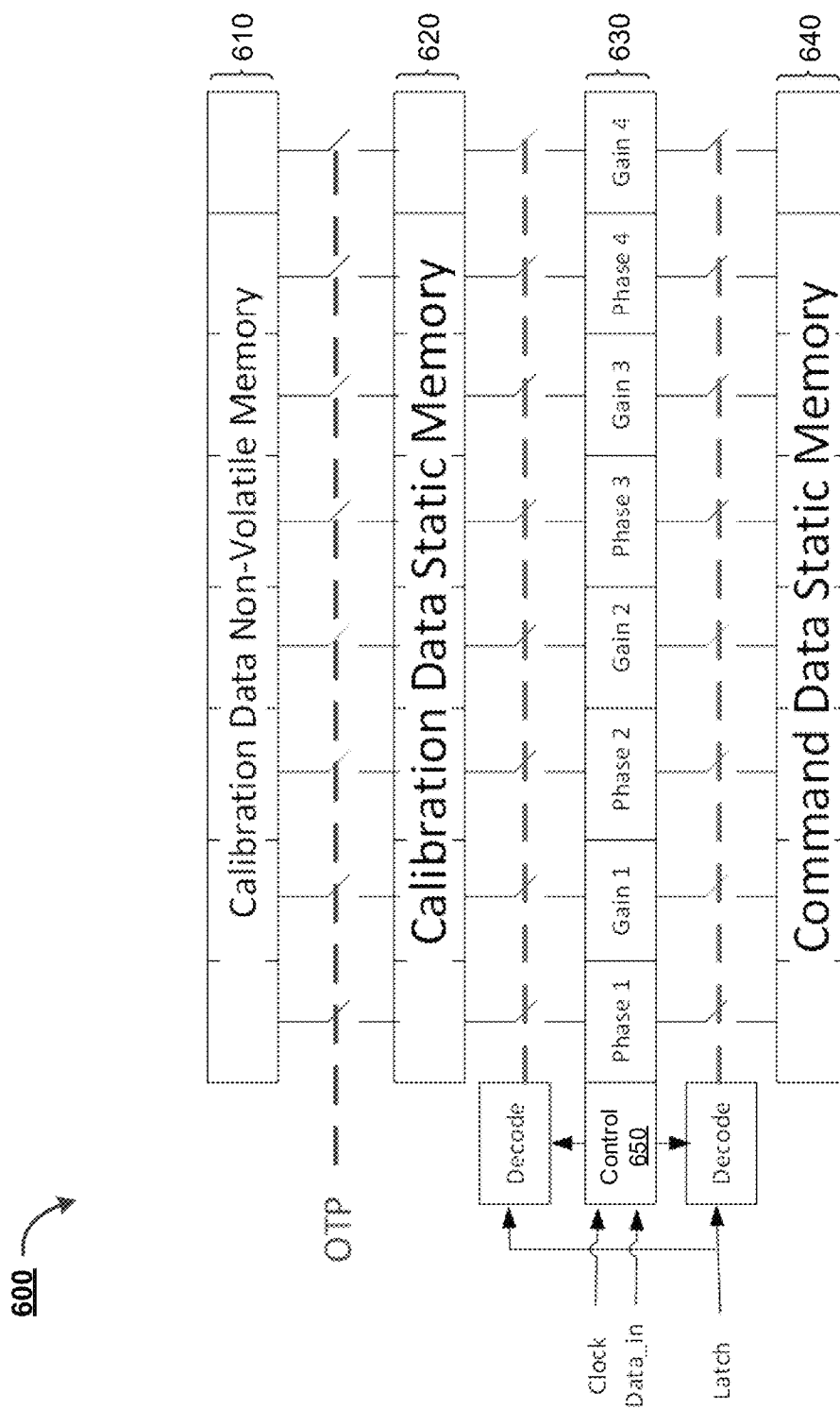
FIG. 6 depicts another example of a serial control system for a beamforming integrated circuit.

FIG. 6 depicts another example of a serial control system 600 for a beamforming integrated circuit. In various implementations, after a gain and a phase of each path within the IC is measured (e.g., during test) and/or found to need correction, calibration data may be permanently stored on the IC. A control circuit or module 650 in the serial stream may determine if data clocked in is intended to be command data or calibration data. If the data is calibration data then the data may be permanently stored on the IC using one-time programming (OTP) or other suitable process.

The non-volatile memory 610 storing the calibration data may allow for the data to remain upon power down of the IC. In various implementations, after an IC is powered on, calibration data may be provided to the static memory 620 from the non-volatile memory 610. In some aspects, this process may be transparent to the host system, which is sending ideal gain and phase setting commands to the IC. Errors that are resident on the IC due to process variations may be internally corrected on the IC without need for intervention by the host system.

Once the calibration data is permanently stored on the IC, the power detection accuracy, gain and phase in each element arm may be corrected. For example, during execution, the phase and gain command data 630 for each element arm may be determined based upon the calibration data from the static memory 620 and/or command data from static memory 640.

Figure 7:
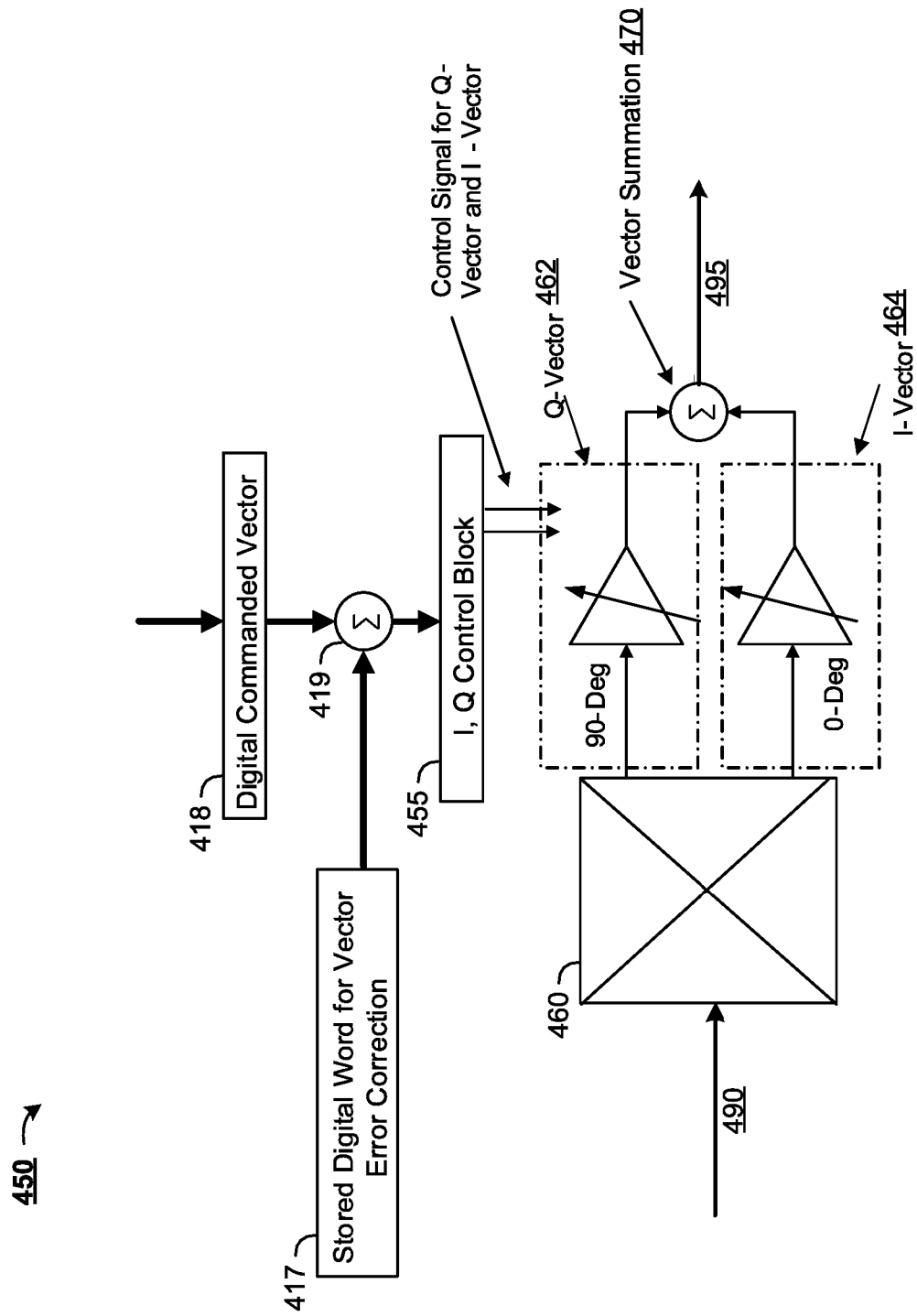
FIG. 7 depicts a block diagram of an example of a vector modulator.

FIG. 7 depicts a block diagram of an example of a vector modulator 450. As noted above, in various embodiments, functions of one or more of the phase controller blocks 312, 322, 332, and 342 (e.g., phase modification) may be combined with functions of the respective gain controller blocks 314, 324, 334, 344 (e.g., amplitude modification). The combined function(s) may be implemented through the use of the vector modulator 450. In some aspects, the vector modulator 450 may be implemented as an IQ vector modulator, which is capable of controlling both the amplitude and the phase of the transmitted signal at the same (or substantially the same) time.

As illustrated, the vector modulator 450 may include a hybrid module 460, which splits a received signal 490 (e.g., a signal generated by a power splitter 350, 355A, or 355B) into two signals which are 90-degrees out-of-phase from each other. These two signals may be referred to as the in-phase component (the "I" vector) and the quadrature-phase component (the "Q" vector). The two signals may be provided to an I-vector module 464 and a Q-vector module 462. As illustrated, each of the Q-vector module 462 and the I-vector module 464 may include a digital variable gain amplifier and/or a digital variable attenuator. These amplifiers and/or attenuators may be used to control the phase and/or amplitude of the input signal 490 such that the output signal 495 is the correct amplitude and/or phase for generation of an RF beam.

As illustrated, the phase and/or amplitude of the I-vector and the Q-vector may be controlled via an IQ control block 455. This control may be based on vector information obtained from memory, similar to the way that the phase shift and amplitude gain information is obtained, as described herein. For example, a digital word 417 for vector error correction from may be stored in non-volatile memory. This digital word 417 may be combined, during operation, with digital command vector 418 (e.g., stored in working memory) via the third digital adder 419. In some embodiments, the digital word is used in digital form. In other embodiments, the digital word is converted into an analog current and voltage (e.g., via a digital to analog converter) before it is used to modify the input signal 490. The stored digital word may reflect a vector error, which is a difference between a desired vector to a measured vector. As described herein, the vector error may be determined by testing one or more of the antennas, and in various embodiments the vector error is stored permanently on an IC. In some aspects, the vector error may be stored as a negative and/or the third digital adder 419 may be configured to add the negative of the vector error to command data to generate the desired control signal for an antenna.

The vector sum may be provided as an input to the IQ control block 455, which in turn provides one or more control signals to the Q-vector module 462 and/or the I-vector module 464. For example, in order to change the amplitude of the input signal 490, the vector modulator 450 may use an amplifier to modify the I vector and another amplifier to modify the Q vector, based on control signals, such that when the two components are combined, they are of a desired amplitude. A similar procedure may be performed to modify the phase of the input signal 490. In various embodiments, the vector modulator 450 may only correct for one of the amplitude or the phase of an input signal, and in other embodiments the vector modulator 450 may correct for both. In some aspects, the correction/modification may be performed through the use of a digital map. As further illustrated, vector summation circuit 470 (e.g., a combiner that combines the vector signals by adding them vectorally) may be used to combine the two components to form the output signal 495.

In some aspects, the resulting output signal 495 may be used to modify a signal provided to an antenna. In various implementations, each element arm 310, 320, 330, and/or 340 may include its own vector modulator 450, which may be alternative from (or in addition to) the separate gain and phase control blocks. Although a 90-degree shift is illustrated, other degrees of phase shift may be used (e.g., −90 degrees).

In some embodiments, the integrated circuit 400 of FIG. 4 and/or the vector modulator 450 of FIG. 7 may further comprise or otherwise utilize a resistor to generate a current. For example, a separate integrated circuit may be configured to utilize a resistor to generate the signal provided to the vector summation circuit 470, generated through the hybrid module 460, and/or a resistor utilized in another component in a chain of one or more components that ultimately provide the signal for use by the integrated circuit 400 or the vector modulator 450. In either event, a resistance of the resistor may be measured (e.g., before or after it is placed in the circuit), and this value may be used in conjunction with a desired current to determine a value of the voltage necessary to generate the desired current. The value of the voltage and/or the resistance may then be stored in non-volatile memory on the integrated circuit. In various embodiments, the voltage and/or the resistance value may be burned onto the IC through OTP or other processes described herein. The non-volatile memory storing the voltage value and/or the resistance value may include the calibration data non-volatile memory 610 or some other non-volatile memory. In some aspects, storing the voltage and/or the resistance in non-volatile memory may provide for pre-calibration of an IC.

Figure 8:
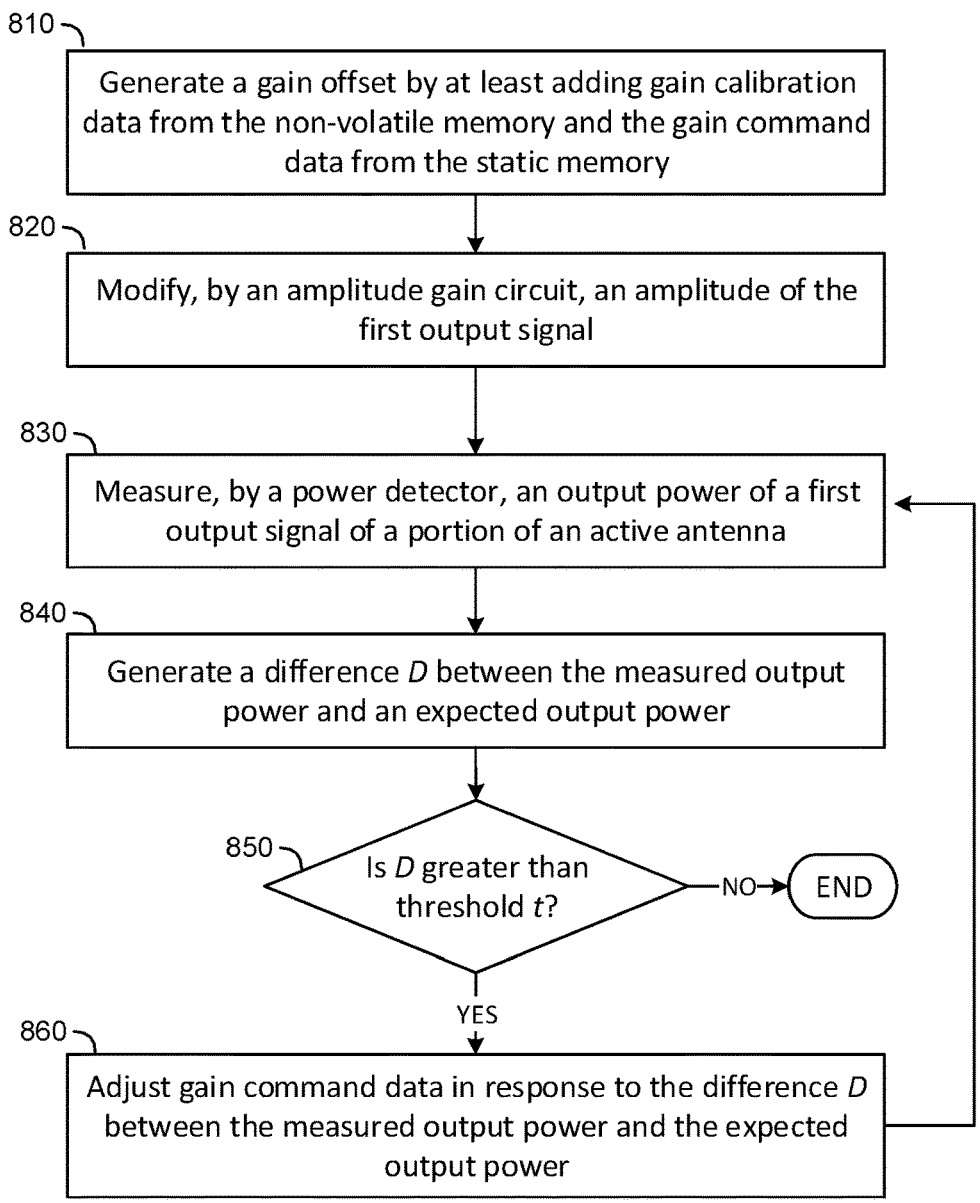
FIG. 8 depicts an example of a process for calibrating an antenna, in accordance with various implementations.

FIG. 8 depicts an example process 800 for calibrating an antenna, in accordance with various implementations. In some aspects, the process 800 may be performed by at least a portion of the integrated circuit 400 of FIG. 4. In some aspects, process 800 calibrates gain for an antenna that is not part of a beamforming array. In some aspects, process 800 calibrates gain for an antenna that is part of a beamforming array process In 810, a first digital adder 416 may generate a gain offset by at least adding gain calibration data obtained from the non-volatile memory and gain command data obtained from the static memory. The generated gain offset is a combination of gain calibration data and gain command data. Gain calibration data may have been measured during testing to correct for variations in the circuit manufacturing process. As gain calibration data may not change over time, gain calibration data may be stored in non-volatile memory. Gain command data corresponds to a gain offset for an antenna to, for example steer the output radiating from a transmitter. Gain command data may change as the radiated output is steered in a different direction. In the example of FIG. 4, the first digital adder 416 combines gain calibration and command data that are stored in the calibration register $gain_1$ and the command register $gain_1$, respectively.

In 820, an amplitude gain controller circuit 314 may modify, based at least in part on the gain offset, an amplitude of the first output signal. For example, the amplitude gain controller circuit 314 may modify, based at least in part on the gain offset, an amplitude of the first output signal. The modified phase of the first output signal and the modified amplitude of the first output signal are provided to enable pre-calibration of the first output signal.

Although gain calibration data may be performed using calibration data, there may be an error in the gain calibration data due to measurement errors when the calibration data was obtained, or due to other factors such as the environment in which the device is used. 830-860 may correct errors in the gain calibration data by measuring radiated output power, comparing the radiated output power to an expected output power, adjusting the gain if the difference exceeds a threshold. 830-860 may be repeated to converge to a corrected gain. Radiated power may be measured using a power detector 100a, which corresponds to the power detector 100 of FIG. 1.

In 830, a power detector 100a measures an output power of a first output signal of a portion of an active antenna. For example, the power detector 100a may measure an output power of an output signal radiated by antenna 317 of antenna arm 310 (FIG. 3). The power detector 100a may have the same structure of power detector 100, as described above with respect to FIG. 1.

In 840, microprocessor 1000 generates a difference D between the measured output power and an expected output power. This difference may be due to a device non-ideality due to variations in the circuit manufacturing process, or other factors.

In 850, microprocessor 1000 determines if the difference D between the measured output power and the expected output power equals or exceeds a threshold t. If not, process 800 ends. If D is greater than threshold t, process 800 continues to 860.

In 860, microprocessor 1000 adjusts gain command data in response to the difference D between the measured output power and the expected output power. For example, microprocessor 1000 may adjust the command register gain$_1$ 415 in response to the difference between the measured output power and the expected output power. After adjusting gain command data, process 800 returns to 830.

Figure 9:
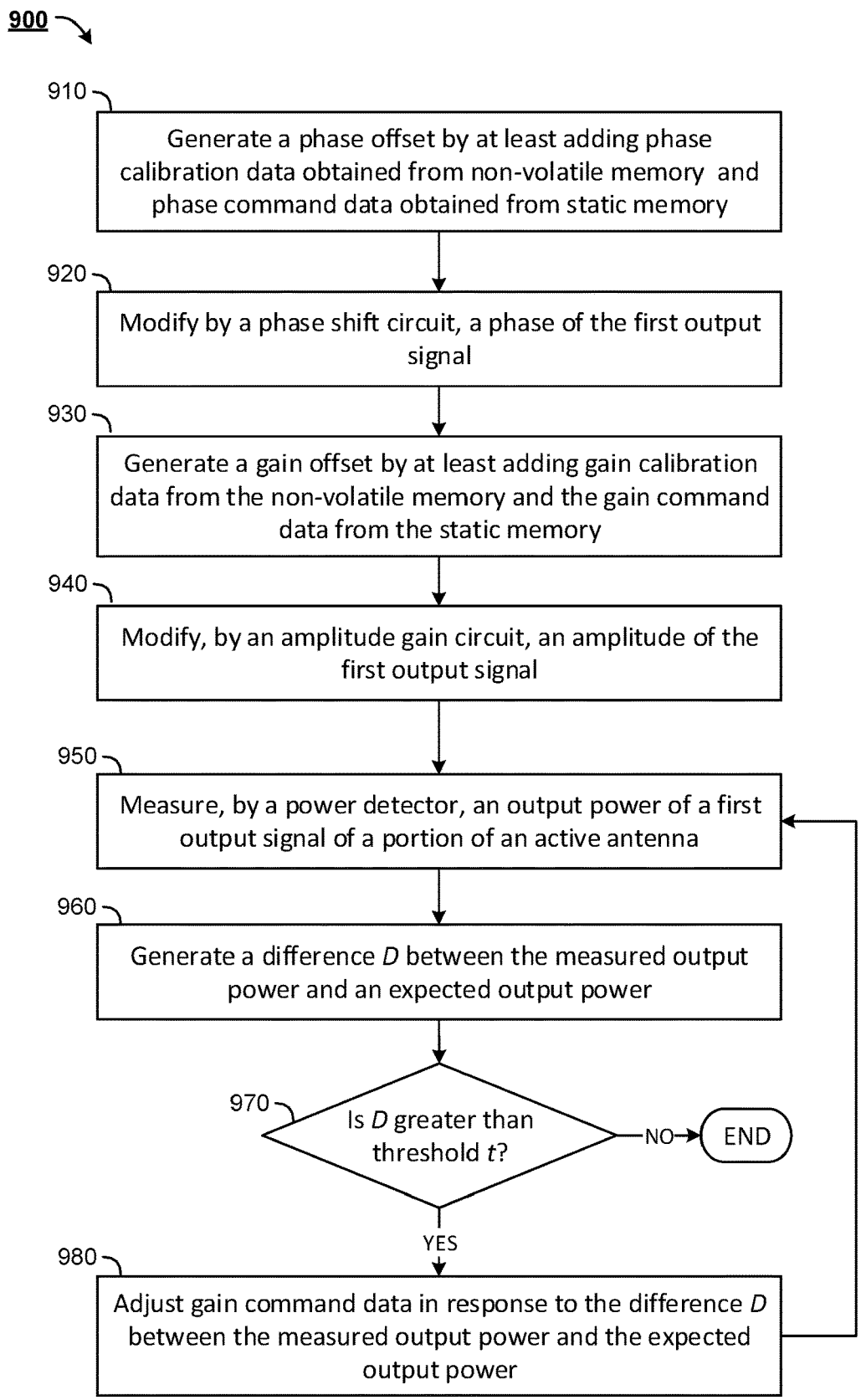
FIG. 9 depicts an example of a process for beamforming calibration of active antennas, in accordance with various implementations.

FIG. 9 depicts an example process 900 for beamforming calibration of active antennas, in accordance with various implementations. In some aspects, the process 900 may be performed by at least a portion of the integrated circuit 400 of FIG. 4.

In 910, a second digital adder 412 may generate a phase offset by at least adding phase calibration data obtained from non-volatile memory and phase command data obtained from static memory. The generated phase offset is a combination of phase calibration data and phase command data. Phase calibration data may have been measured during testing to correct for variations in the circuit manufacturing process. As phase calibration data may not change over time, phase calibration data may be stored in non-volatile memory. Phase command data corresponds to a phase offset for an antenna to, for example steer the output radiating from a transmitter. Phase command data may change as the radiated output is steered in a different direction. In the example of FIG. 4, the second digital adder 412 combines phase calibration and command data that are stored in the calibration register phase$_1$ and the command register phase$_1$, respectively.

In 920, a phase controller circuit 312 may modify, based at least in part on the phase offset, a phase of a first output signal. For example, the phase controller circuit 312 may introduce a phase shift corresponding to the phase offset generated in 940.

In 930, a first digital adder 416 may generate a gain offset by at least adding gain calibration data obtained from the non-volatile memory and gain command data obtained from the static memory. The generated gain offset is a combination of gain calibration data and gain command data. Gain calibration data may have been measured during testing to correct for variations in the circuit manufacturing process. As gain calibration data may not change over time, gain calibration data may be stored in non-volatile memory. Gain command data corresponds to a gain offset for an antenna to, for example steer the output radiating from a transmitter. Gain command data may change as the radiated output is steered in a different direction. In the example of FIG. 4, the first digital adder 416 combines gain calibration and command data that are stored in the calibration register gain$_1$ and the command register gain$_1$, respectively.

In 940, an amplitude gain controller circuit 314 may modify, based at least in part on the gain offset, an amplitude of the first output signal. For example, the amplitude gain controller circuit 314 may modify, based at least in part on the gain offset, an amplitude of the first output signal. The modified phase of the first output signal and the modified amplitude of the first output signal are provided to enable pre-calibration of the first output signal.

There may be an error in the gain calibration data due to measurement errors when the calibration data was obtained, or due to other factors such as the environment in which the device is used. 950-980 may correct errors in the gain calibration data by measuring radiated output power, comparing the radiated output power to an expected output power, adjusting the gain if the difference exceeds a threshold. 950-980 may be repeated to converge to a corrected gain. Radiated power may be measured using a power detector 100a, which corresponds to the power detector 100 of FIG. 1.

In 950, a power detector 100a measures an output power of a first output signal of a portion of an active antenna. For example, the power detector 100a may measure an output power of an output signal radiated by antenna 317 of antenna arm 310 (FIG. 3). The power detector 100a may have the same structure of power detector 100, as described above with respect to FIG. 1.

In 960, microprocessor 1000 generates a difference D between the measured output power and an expected output power. This difference may be due to a device non-ideality due to variations in the circuit manufacturing process, or other factors.

In 970, microprocessor 1000 determines if the difference D between the measured output power and the expected output power equals or exceeds a threshold t. If not, process 900 ends. If D is greater than threshold t, process 900 continues to 980.

In 980, microprocessor 1000 adjusts gain command data in response to the difference D between the measured output power and the expected output power. For example, power detector 100a may adjust the command register gain$_1$ 415 in response to the difference between the measured output power and the expected output power. After adjusting gain command data, process 900 returns to 950.

In some implementations, the first output signal may be provided as the input after modifying the phase and the amplitude. In various aspects, the modified phase of the first output signal and the modified amplitude of the first output signal are provided to enable pre-calibration of the first output signal and/or a first antenna 317, for example. A pre-calibrated antenna may refer to an antenna which is calibrated at design time, production time, manufacture time, and/or testing time. Thus, during operation of the antenna (e.g., used by a user or equipment), the requirement for calibration may be reduced and/or eliminated.

In some aspects, the first output signal is useable to provide a first radio signal to form at least a first portion of a direction-controlled beam. For example, in 850, a first antenna 116 may provide a first radio signal to form at least a first portion of a direction-controlled beam. In various implementations, the first antenna 317 is separate from the integrated circuit 400 and in other implementations the first antenna 317 is part of the integrated circuit 400.

In some aspects, process 900 may further include providing, via a second antenna, for example antenna 327 of FIG. 3, a second output radio signal to a point in space where the where the first output radio signal constructively interferes with each other to form a direction-controlled beam. In this example, antenna 327 and active array element arm 320 may have a similar structure and similar components as antenna 317 and active array element arm 310, as depicted in FIGS. 3 and 4.

In some aspects, process 900 may further include providing, via multiple antennas, multiple output radio signals to a point in space where the output radio signals constructively interfere with each other to form a direction-controlled beam. For example, multiple antennas 317, 327, 337, and 347 and active array element arms 310, 320, 330, and 340 (FIG. 3) may output radio signals that from a direction-controlled beam. In this example, antennas 327, 337, and 347 and active array element arms 320, 330, and 340 may have a similar structure and similar components as output amplifier 316, antenna 317 and active array element arm 310, as depicted in FIGS. 3 and 4.

Referring to FIG. 3, a first antenna 317, for example, is enabled to provide, based on the first output signal, a first radio signal towards a point in space away from the apparatus to form at least a first portion of a direction-controlled beam. The second antenna is enabled to provide, based on the second output signal, a second radio signal towards the point to form at least a second portion of the direction-controlled beam. In various implementations, additional antennas may be present.

In some aspects, at least the phase calibration data and the gain calibration data are programmed into the non-volatile memory through at least one of burning of fuses, one-time programming, and electrically erasable programmable read-only memory. For example, the phase calibration data may be programmed into the non-volatile memory based at least in part on a measured difference in phase between a first digital signal that is provided to a first antenna 317, for example, and a second radio signal that is output by the first antenna 317, where the second radio signal is based on the first digital signal. Similarly, the gain calibration data may be programmed into the non-volatile memory based at least in part on a measured difference in amplitude between a first digital signal that is provided to a first antenna 317, for example, and a second radio signal that is output by the first antenna 317, where the second radio signal is based on the first digital signal. This first digital signal may be provided to the first antenna 317, for example, at design time, production time, manufacture time, and/or testing time, where an amplitude and/or phase of the second radio signal generated based on the first digital signal are measured. Based at least in part upon these measurements, phase and/or amplitude calibration data may be permanently stored on the integrated circuit 400, for example. These measurements may be taken at/near a point in space away from the integrated circuit 400 where the direction-controlled beam is intended to be formed (at least in part).

During operation, command data, such as the phase command data and/or the gain command data, may be determined, temporarily stored in a register, and/or provided to the integrated circuit 400, for example. This command data may be used to control operation of one or more antennas to form the direction-controlled beam. For example, the command data may be based on and/or used to control a desired characteristic of the direction-controlled beam, such as a direction and/or strength of the beam.

In some aspects, the process 800 may include receiving, by one or more power splitting circuits 150, 155A, 155B, for example, a first digital signal from an input source 360, for example. In accordance with these aspects, the one or more power splitting circuits 150, 155A, 155B, for example, may provide a plurality of digital signals to a plurality of antennas, where the plurality of digital signals comprises the first output signal. As described herein, one or more of the plurality of digital signals may be modified based on properties of the respective antennas to which the digital signal is provided. In some aspect, one or more of the plurality of digital signals may be substantially the same in amplitude, phase, and/or the like before they are modified.

In various implementations, process 900 may include generating, by a third digital adder 419 (FIG. 4), for example, a vector offset by at least adding vector calibration data obtained from non-volatile memory and vector command data obtained from static memory. Process 900 may also include modifying, by a vector correction circuit 450 (or a portion thereof), for example, a phase and/or an amplitude of a first output signal 490, for example, based at least in part on the vector offset. The modified phase of the first output signal and/or the modified amplitude of the first output signal may be provided to enable pre-calibration of the first output signal and/or a first antenna 317, for example. In some aspects, the vector calibration data includes a stored digital word 417, for example, which indicates an offset for one or both of the phase of the first output signal and the amplitude of the first output signal. In related embodiments, the vector command data is based on a desired characteristic of a direction-controlled beam (e.g., command data for the operation of an antenna).

As a non-limiting example of a benefit of the process 900, time spent processing/calculating amplitude gain and/or phase shift data for one or more of a plurality of antennas in an active antenna may be reduced, and/or efficiency of an active antenna may be improved.

As used herein, generating may refer to the actual generation of a radio-wave signal or may refer to the modification of a radio-wave signal which was originally generated by another circuit and/or device.

Although some specific examples are disclosed herein, they are merely examples as other types of circuits and component values may be used as well including sizing of components, differences in the logic circuits implementing the control, differences in the waveforms implementing the timing of the modulators, and/or the like.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively, or additionally, store such machine instructions in a transient manner, such as for example, as would a processor cache or other random access memory associated with one or more physical processor cores.

To provide for interaction with a user, one or more aspects or features of the subject matter described herein can be implemented on a computer which may access a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive track pads, voice recognition hardware and software, optical scanners, optical pointers, digital image capture devices and associated interpretation software, and the like.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An apparatus comprising:
    a first digital adder configured to at least generate a gain offset by at least adding gain calibration data from non-volatile memory and gain command data from static memory;
    an amplitude gain circuit configured to at least modify, based at least in part on the gain offset, an amplitude of a first output signal of a first antenna, wherein the modified amplitude of the first output signal is provided to enable pre-calibration of the first output signal;
    a power detector configured to at least measure an output power of the first output signal; and
    at least one processor, configured to at least generate a difference between the measured output power and an expected output power, the at least one processor further configured to at least adjust gain command data in response to the difference between the measured output power and the expected output power.

2. The apparatus of claim 1, wherein the power detector comprises:
    an analog power detector configured to at least detect the signal power of the first output signal;
    an analog-to-digital converter configured to at least digitize the detected signal level;
    a non-volatile memory configured to at least provide an offset correction value; and
    a combiner circuit configured to at least correct the digitized signal power with the offset correction value.

3. The apparatus of claim 2, further comprising: a limiter circuit configured to at least apply a limit function to the corrected signal power.

4. The apparatus of claim 1, further comprising: a plurality of antennas configured to at least provide a plurality of radio signals to a point in space where the plurality of radio signals constructively interfere with each other to form a directionally controlled beam, wherein the plurality of antennas includes the first antenna.

5. The apparatus of claim 4, further comprising:
    a second digital adder configured to at least generate a phase offset by at least adding phase calibration data obtained from the non-volatile memory and phase command data obtained from the static memory; and
    a phase-shift circuit configured to at least modify, based at least in part on the phase offset, a phase of the first output signal, wherein the modified phase of the first output signal is provided to enable pre-calibration of the first output signal.

6. The apparatus of claim 1, wherein the at least one processor is further configured to compare the generated difference between the measured output power and an expected output power to a threshold, and adjust gain command data iteratively until the generated difference is less than the threshold.

7. The apparatus of claim 1, wherein at least the gain calibration data is programmed into the at least one non-volatile memory via burning of fuses, one-time programming, and/or electrically erasable programmable read-only memory.

8. A method, comprising:
generating, by a first digital adder, a gain offset by at least adding gain calibration data from at least one non-volatile memory and gain command data from at least one static memory;
modifying, by an amplitude gain circuit and based at least in part on the gain offset, an amplitude of a first output signal of a first antenna, wherein the modified amplitude of the first output signal is provided to enable pre-calibration of the first output signal;
measuring, by a power detector, an output power of the first output signal;
generating, by at least one processor, a difference between the measured output power and an expected output power; and
adjusting, by the at least one processor, gain command data in response to the difference between the measured output power and the expected output power.

9. The method of claim 8, wherein measuring an output power of the first output signal comprises:
detecting, by an analog power detector, the signal power of the first output signal;
digitizing, by an analog-to-digital converter, the detected signal level;
providing, by a non-volatile memory, an offset correction value; and
correcting, by a combiner circuit, the digitized signal power with the offset correction value.

10. The method of claim 9, wherein measuring the output power of the first output signal further comprises: applying, by a limiter circuit, a limit function to the corrected signal power.

11. The method of claim 8, further comprising: providing, via a plurality of antennas, a plurality of radio signals to a point in space where the plurality of radio signals constructively interfere with each other to form a directionally controlled beam, wherein the plurality of antennas includes the first antenna.

12. The method of claim 11, further comprising:
generating, by a second digital adder, a phase offset by at least adding phase calibration data obtained from the non-volatile memory and phase command data obtained from the static memory; and
modifying, by a phase-shift circuit and based at least in part on the phase offset, a phase of a first output signal, wherein the modified phase of the first output signal is provided to enable pre-calibration of the first output signal.

13. The method of claim 8, further comprising:
comparing, by the at least one processor, the generated difference between the measured output power and an expected output power to a threshold; and
adjusting, by the at least one processor, gain command data, iteratively, until the generated difference is less than the threshold.

14. The method of claim 8, wherein at least the gain calibration data is programmed into the non-volatile memory via burning of fuses, one-time programming, and/or electrically erasable programmable read-only memory.

15. An apparatus, comprising:
means for generating a gain offset by at least adding gain calibration data from non-volatile memory and gain command data from static memory;
means for modifying, based at least in part on the gain offset, an amplitude of a first output signal of a first antenna, wherein the modified amplitude of the first output signal is provided to enable pre-calibration of the first output signal;
means for measuring an output power of the first output signal;
means for generating a difference between the measured output power and an expected output power; and
means for adjusting gain command data in response to the difference between the measured output power and the expected output power.

16. The apparatus of claim 15, wherein measuring the output power of the first output signal comprises:
means for detecting the signal power of the first output signal;
means for digitizing the detected signal level;
means for providing an offset correction value; and
means for correcting the digitized signal power with the offset correction value.

17. The apparatus of claim 16, wherein measuring the output power of the first output signal comprises: means for applying a limit function to the corrected signal power.

18. The apparatus of claim 15, further comprising: means for providing a plurality of radio signals to a point in space where the plurality of radio signals constructively interfere with each other to form a directionally controlled beam, wherein the means for providing a plurality of radio signals includes the first antenna.

19. The apparatus of claim 18, further comprising:
means for generating a phase offset by at least adding phase calibration data obtained from the non-volatile memory and phase command data obtained from the static memory; and
means for modifying, based at least in part on the phase offset, a phase of the first output signal, wherein the modified phase of the first output signal is provided to enable pre-calibration of the first output signal.

20. The apparatus of claim 15, further comprising:
means for comparing the generated difference between the measured output power and an expected output power to a threshold; and
means for adjusting gain command data, iteratively, until the generated difference is less than the threshold.

21. A non-transitory computer-readable medium storing instructions, which when executed by at least one data processor, result in operations comprising:
generating a gain offset by at least adding gain calibration data from at least one non-volatile memory and gain command data from at least one static memory;
modifying, based at least in part on the gain offset, an amplitude of a first output signal of a first antenna, wherein the modified amplitude of the first output signal is provided to enable pre-calibration of the first output signal;
measuring an output power of the first output signal;
generating a difference between the measured output power and an expected output power; and
adjusting gain command data in response to the difference between the measured output power and the expected output power.

* * * * *